(12) United States Patent
Chen

(10) Patent No.: US 6,541,350 B2
(45) Date of Patent: Apr. 1, 2003

(54) METHOD FOR FABRICATING SHALLOW TRENCH ISOLATION

(75) Inventor: Wei-Wen Chen, Hsinchu (TW)

(73) Assignee: Macronix International Co., Ltd. (TW)

(*) Notice: Subject to any disclaimer, the term of this patent is extended or adjusted under 35 U.S.C. 154(b) by 77 days.

(21) Appl. No.: 09/768,613

(22) Filed: Jan. 25, 2001

(65) Prior Publication Data

US 2002/0055236 A1 May 9, 2002

(30) Foreign Application Priority Data

Nov. 8, 2000 (TW) .......................... 89123644 A

(51) Int. Cl.[7] ............................................. H01L 21/76
(52) U.S. Cl. ..................... 438/424; 438/434; 438/435
(58) Field of Search ................... 438/424, 435, 438/437

(56) References Cited

U.S. PATENT DOCUMENTS 6,156,620 A * 12/2000 Puchner et al. ............. 438/400
6,238,998 B1 * 5/2001 Leobandung ............... 438/296
6,323,106 B1 * 11/2001 Huang et al. ............... 438/424

OTHER PUBLICATIONS

Stanley Wolf Ph.D. and Richard N. Tauber Ph.D. in Silicon Processing for the VLSI Era, vol. 1: Process Technology, Lattice Press, 1986, pp. 209–210, 531–534.*

* cited by examiner

Primary Examiner—Olik Chaudhuri
Assistant Examiner—William M. Brewster

(57) ABSTRACT

A method for forming shallow trench isolation is disclosed. A pad oxide layer and a mask layer are sequentially formed on a substrate. Afterwards, an opening is formed through the mask layer and the pad oxide layer such that regions of the substrate are exposed. Thereafter, the exposed regions are etched to form trenches inside said substrate. Next, nitrogen ions are implanted into the sidewall of the trenches to form a silicon nitride layer, and then a siliconoxynitride layer is formed inside the sidewall of the trenches. Subsequently, a silicon oxide layer is formed on the siliconoxynitride layer and on the mask layer. The excess portion of the silicon oxide layer over said mask layer is removed to expose the mask layer, and then the mask layer is removed away. Finally, the pad oxide layer is removed by using hydrofluoric acid (HF).

20 Claims, 5 Drawing Sheets

METHOD FOR FABRICATING SHALLOW TRENCH ISOLATION

FIELD OF THE INVENTION

The present invention generally relates to a method for manufacturing semiconductor devices, and more particularly, to a method for fabricating shallow trench isolation in semiconductor devices.

BACKGROUND OF THE INVENTION

With the fast developments of semiconductor process technology, the dimensions of integrated circuits (ICs) are rapidly scaled down into sub-micron level. Oxide isolation regions are usually incorporated with active areas of IC devices during the period of semiconductor processes. In general, a local oxidation (LOCOS) process is employed to form these oxide isolation regions, but the LOCOS process may induce a bird's beak structure such that the active areas of devices are unacceptably encroached. Therefore, shallow trench isolation (STI) process is widely used to form isolation regions between active areas. The conventional process of fabricating shallow trench isolation is shown in FIG. 1A to FIG. 1D.

Referring to FIG. 1A, a pad oxide layer 102 and a silicon nitride layer 104 are sequentially formed on a substrate 100, and then a shallow trench 106 is formed thereon by a photolithography and etching process. Afterward, a thermal oxidation process is carried out to form a lining oxide layer 110 on sidewall 108 of shallow trench 106.

Referring to FIG. 1B and FIG. 1C, an implant process is performed to form a siliconoxynitride (SiON) layer 112 on the lining oxide layer 110. Afterwards, a high-density plasma chemical vapor deposition (HDPCVD) process is carried out to deposit a silicon oxide layer 120 on the silicon nitride layer 104 and inside the trench. The excess silicon oxide over the silicon nitride layer 104 is removed away by a chemical mechanical polishing (CMP) process.

Generally, a thicker lining oxide layer 110 is necessary to be deposited in conventional process. Thereafter, a siliconoxynitride (SiON) layer 112 is formed by a nitrogen-implanted process (114,116,118).

However, the thicker lining oxide layer 110, on one hand, will consume a large amount of substrate 100 material such that the trench 106 easily encroach outwardly on the active areas (not shown) resulting in worse trench topography. On the other hand, if the lining oxide layer 110 is thinner, the crystalline structure of trench sidewall 108 may be damaged by a large number of ions induced by high-density plasma at the start-up period of the process. Furthermore, the isolation effect of the shallow trench 106 will be severely downgraded after the silicon oxide plug is entirely generated.

In addition, the implant angles for operating ion implanter must be switched frequently to adapt to various processes so that the manufacturing time and cost of trench will considerably increase.

Referring to FIG. 1D, the silicon nitride layer 104 is stripped by hot phosphoric acid ($H_3PO_4$) and the pad oxide layer 102 is etched away by hydrofluoric acid (HF). At the time, a silicon oxide plug 122 is left inside the shallow trench 106. While the pad oxide layer 102 is being removed, the silicon oxide plug 122 and the lining oxide layer 110 are also simultaneously etched.

Generally speaking, the etch rate of the pad oxide layer 102 formed by thermal oxidation is smaller than that of the silicon oxide plug 122 formed by HDPCVD process when using HF as an etchant. Consequently, after the lining oxide layer 110 is removed, the corroded edge of silicon oxide plug 122 may result in current leakage. The thicker siliconoxynitride layer 112 is deposited, the more severe the silicon oxide plug 122 is damaged. Since a long time of etching process is implemented, thus the silicon oxide plug 122 is strictly encroached, making the edge recess of the silicon oxide plug 122 acutely, which evokes many problems, such as sub-threshold voltage and current leakage.

SUMMARY OF THE INVENTION

In view of the problems encountered with the foregoing conventional shallow trench isolation, for example, there are some degree of substrate overuse, plasma damage of crystalline structure of trench, and edge recess of the silicon oxide plug.

As a result, the primary object of the present invention is, before the HDPCVD process is implemented, that the trench is implanted by nitrogen ions to form silicon nitride, followed that the siliconoxynitride layer is formed by thermal oxidation process. During the thermal oxidation process, the siliconoxynitride layer can be formed with ease by a small amount of substrate, correspondingly increasing the regions of the active area.

Another object is using the siliconoxynitride layer to prevent the crystalline structure of the trench from high-density plasma damages.

Still another object is utilizing the siliconoxynitride so as to prohibit the silicon oxide plug form recess.

In the preferred embodiment of the present invention, a pad oxide layer and a mask layer is sequentially formed on a substrate. Afterwards, an opening is formed through the mask layer and the pad oxide layer such that regions of the substrate are exposed. Thereafter, the exposed regions are etched to form trenches inside the substrate. Next, nitrogen ions are implanted into the sidewall of the trenches to form a silicon nitride layer, and then a siliconoxynitride layer is formed inside the sidewall of the trenches. Subsequently, a silicon oxide layer is formed on the siliconoxynitride layer and on the mask layer. The excess portion of the silicon oxide layer over said mask layer is removed to expose the mask layer, and then the mask layer is removed away. Finally, the pad oxide layer is removed by using hydrofluoric acid (HF).

In summary, the silicon nitride layer is formed prior to the formation of the silicon oxide. Thereafter, the siliconoxynitride layer is formed by the thermal oxidation process, which can effectively prevent the crystalline structure of trench from high-density plasma damage to reduce the probability of current leakage. At the same time, the siliconoxynitride layer is utilized for protecting the silicon oxide plug.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention provides a method for forming shallow trench isolation. A siliconoxynitride is formed on sidewall of the trench to generating a better trench topography.

As shown in FIGS. 2–8, these figures illustrate cross-sectional views of a process for forming shallow trench isolation in accordance with the present invention.

Figure 1:
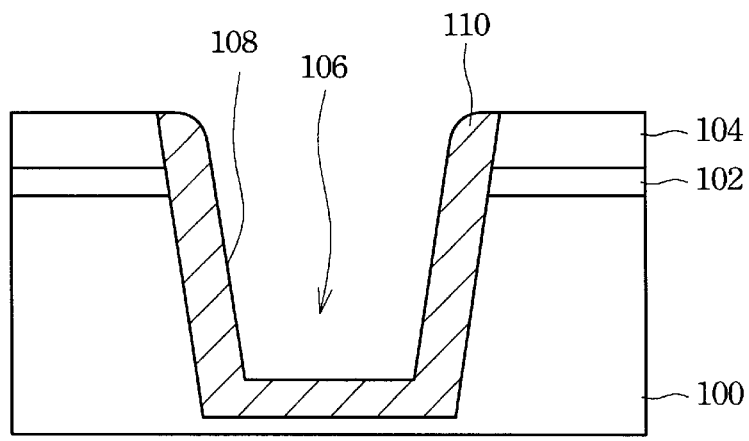
FIGS. 1A–1D illustrate cross-sectional views of a conventional process for forming shallow trench isolation.
Figure 1:
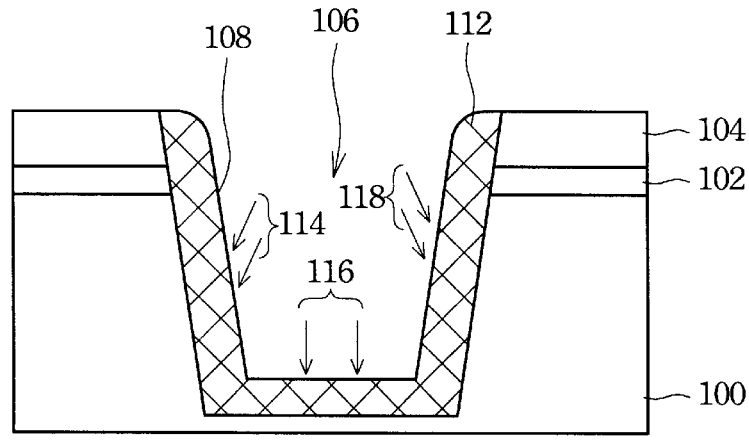
Figure 1:
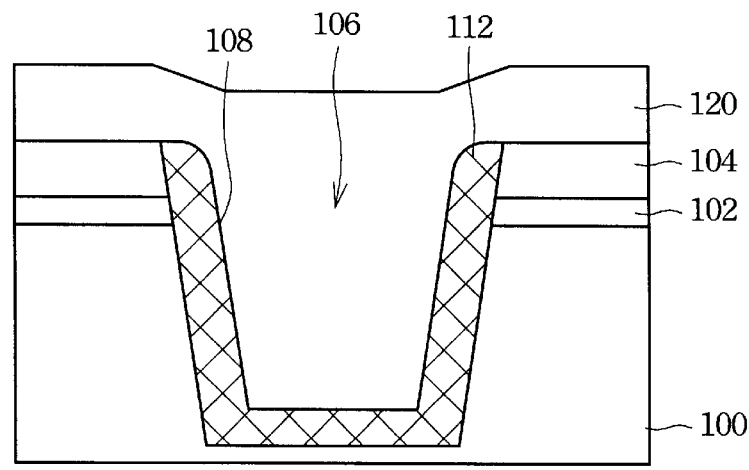
Figure 1D:
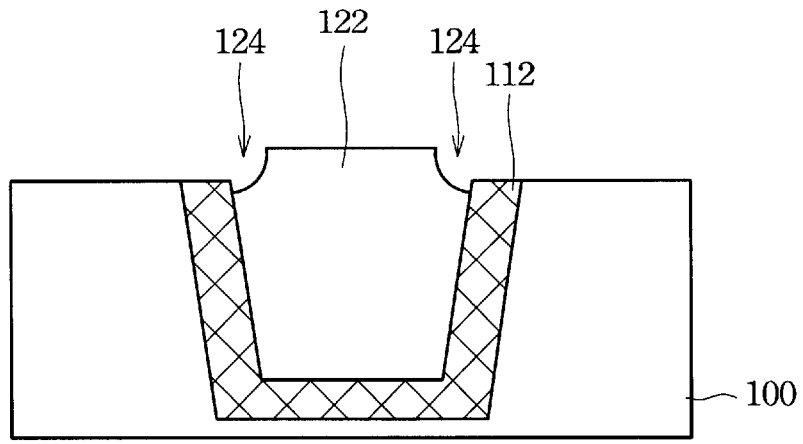
Figure 2:
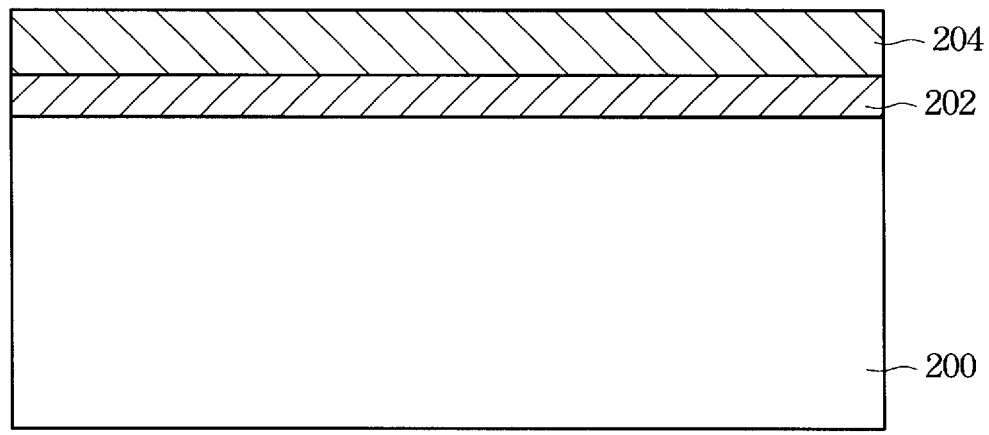
FIGS. 2–8 illustrate cross-sectional views of a process for forming shallow trench isolation according to the preferred embodiment of the present invention.

Referring FIG. 2, a pad oxide layer 202 is formed on a substrate 200, and then a mask layer 204 is deposited on the pad oxide layer 202 wherein the mask layer 204, such as silicon nitride (SiN) formed by low pressure chemical vapor deposition (LPCVD), is used as a etching mask. The pad oxide layer 202 is used to prevent stress damage when the mask layer 204 is deposited thereon.

Figure 3:
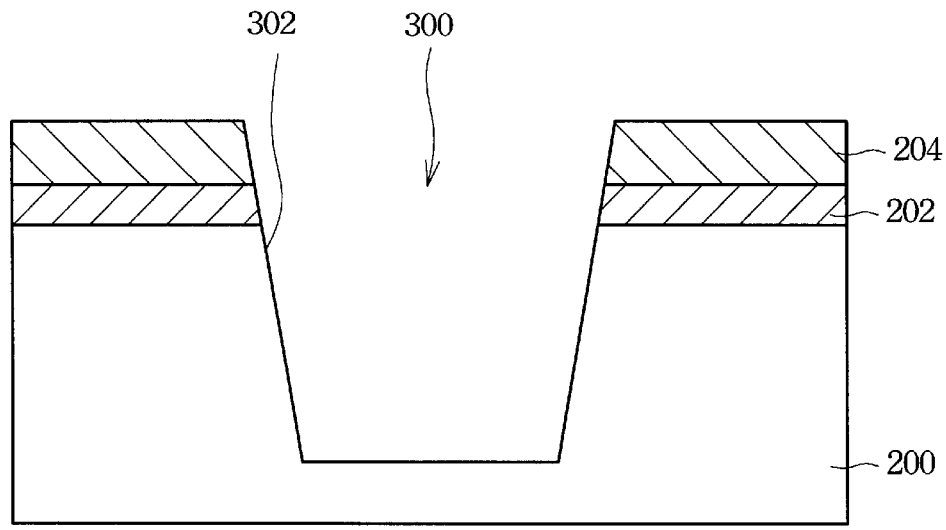

Referring FIG. 3, the mask layer 204 and the pad oxide layer 202 are patterned and expose a portion of substrate 200. The exposed portion of the substrate 200 is subsequently etched to form a shallow trench 300 wherein the patterned mask layer 204 is served as an etching mask.

Figure 4:
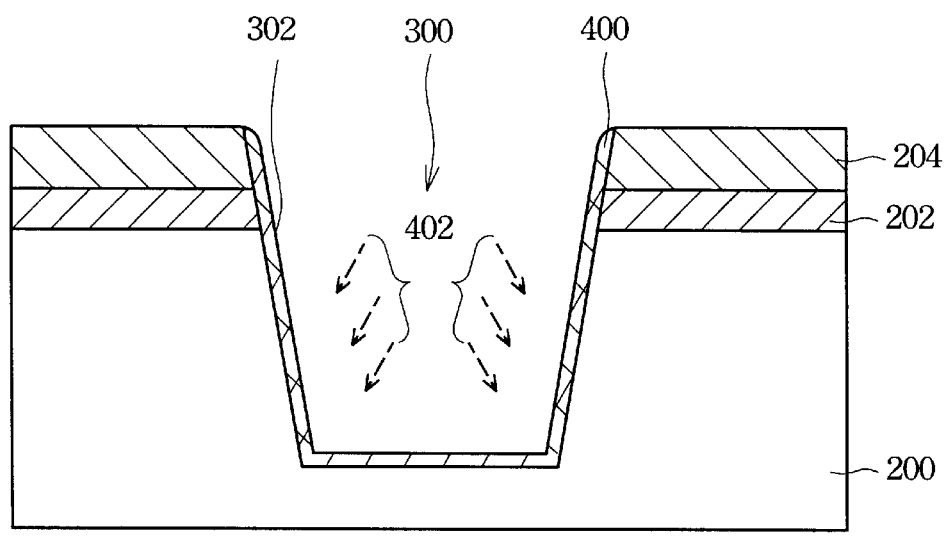

Referring to FIG. 4, after the dopant is ionized, the concentration and the distribution of the dopant are controlled precisely during the period of implant process. The ionized dopant is implanted into the trench 300 sidewall 302 of the substrate 200 by accelerator to form silicon nitride (SiN) layer 400, wherein the thickness of silicon nitride layer 400 is between about 25 and 200 angstroms. In the preferred embodiment of the present invention, the nitrogen atoms is used as dopant, such as NO, $N_2$ and $NH_3$, wherein the energy 402 of the implant process is between about 1 keV and about 10 keV. Additionally, the nitrogen ionized dosage for implanting is between about $1E15/cm^3$ and $1E17/cm^3$. The tilt angle of implant process is between about 7° and 30°, and the twist angle is 90°. Therefore, the wafer is readily rotated with four times (360° of a cycle) to complete the whole implant process.

As a result, in the present invention, only a fixed twist angle is used to effortlessly finish the whole implant process of the trench 300. On the contrary, in the conventional process, ions implant process is completed by various tilt angles during an implant process. Further, the present invention can implant various aspect ratio of trench 300 by merely adjusting the tilt angles, which is more suitable for small dimension scale so as to increase the integrity of the ICs.

Figure 5:
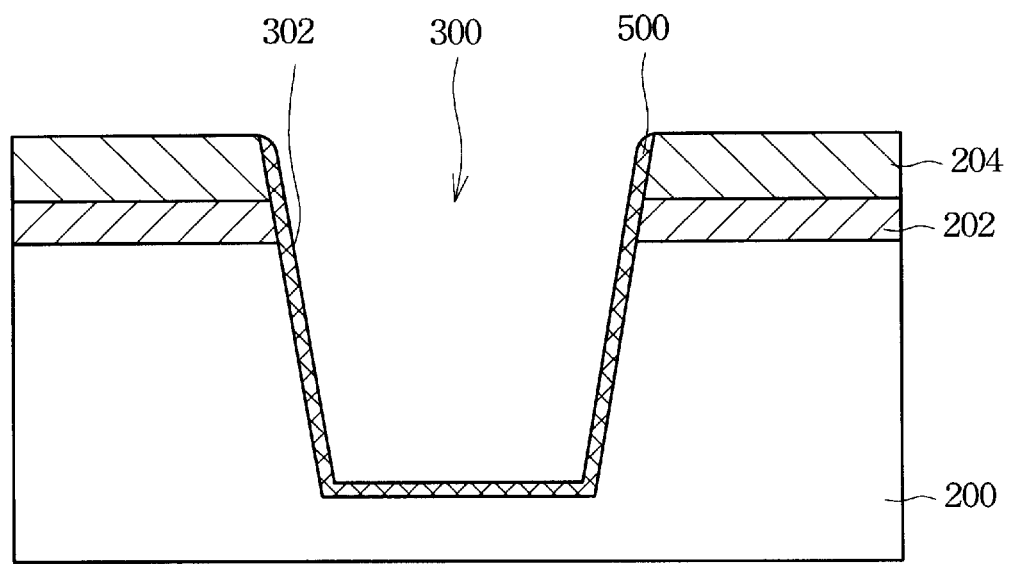

Referring to FIG. 5, the siliconoxynitride layer 500 is formed on the silicon nitride layer 400 by a thermal oxidation process, wherein the thickness of the siliconoxynitride layer 500 is between about 25 and 200 angstroms, and the operation temperature of thermal oxidation process is between about 650° C. and 900° C. Since only a small amount of substrate 200, when the thickness of silicon nitride layer 400 is at least 25 angstroms, is needed to form the siliconoxynitride layer 500 so that the time of manufacture process is diminished and the probability of the trench 300 encroachment on the active regions (not shown) is further reduced. Furthermore, the siliconoxynitride layer 500 is a good kind of passivation material, since the siliconoxynitride layer 500 can alleviate the interface stress and better resistance proof from away moisture and defects.

Figure 6:
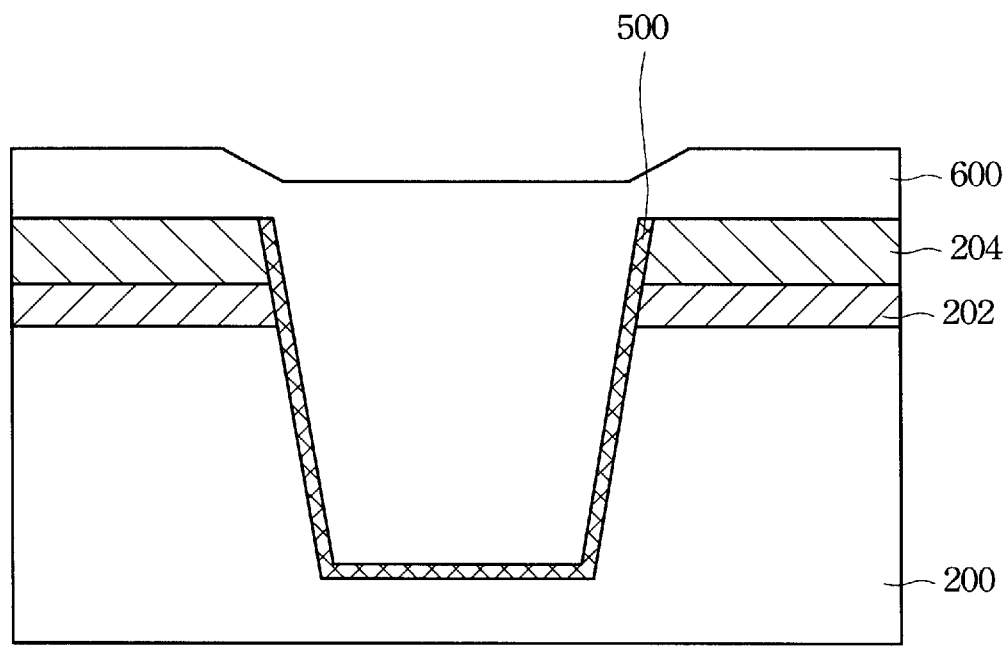

Referring to FIG. 6, a silicon oxide layer 600 is deposited on substrate 200 and inside the trench 300 by a HDPCVD process wherein the thickness of the silicon oxide layer 600 is between about 3000 and 14000 angstroms. The silicon nitride layer 400 is generally formed prior to the deposition of the silicon oxide layer 600. Thereafter, the siliconoxynitride layer 500 is formed by the thermal oxidation process, which can effectively inhibit the crystalline structure of trench 300 from high-density plasma damage.

Figure 7:
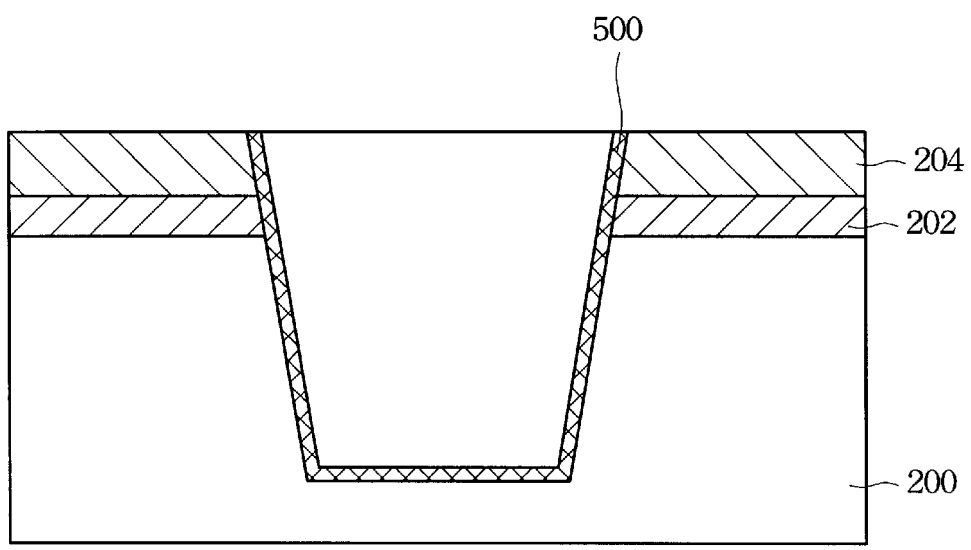

Referring to FIG. 7, the excess silicon oxide over the siliconoxynitride layer 500 is removed by using etch back process or CMP method.

Figure 8:
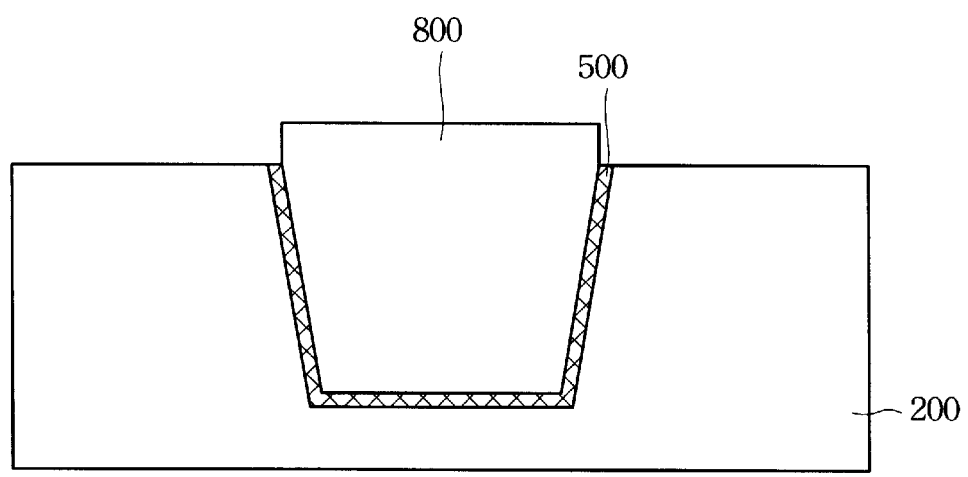

Referring to FIG. 8, the mask layer 204, such as silicon nitride, may be stripped by hot phosphoric acid ($H_3PO_4$) and the pad oxide layer 202 is etched away by hydrofluoric acid (HF). At the time, a silicon oxide plug 800 is left inside the shallow trench 300. Usually, the etch rate of the pad oxide layer 202 formed by thermal oxidation is smaller than that of the silicon oxide plug 800 formed by HDPCVD process when HF is used as an etchant. While the lining layer 202 is removing, the siliconoxynitride layer 500 serves as a protection layer of the silicon oxide plug 800 to avoid the recess edge of the silicon oxide plug 800.

According to the above-mentioned, the silicon nitride layer 400 is formed prior to the formation of the silicon oxide. Thereafter, the siliconoxynitride layer 500 is formed by the thermal oxidation process, which can effectively prevent the crystalline structure of trench 300 from high-density plasma damage to reduce the probability of current leakage. At the same time, the siliconoxynitride layer 500 is utilized for protecting the silicon oxide plug 800.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for forming shallow trench isolation, comprising the steps of:

forming a pad oxide layer on a substrate;

forming a mask layer on said pad oxide layer;

forming an opening through said mask layer and said pad oxide layer such that regions of said substrate are exposed;

etching said exposed regions to form trenches inside said substrate;

implanting nitrogen ions into the sidewall of said trenches to form a silicon nitride layer;

forming a siliconoxynitride layer on said sidewall of said trenches after said step of implanting nitrogen ions;

forming a silicon oxide layer on said siliconoxynitride layer and said mask layer;

removing the excess portion of said silicon oxide layer over said mask layer to expose said mask layer;

removing said mask layer; and removing said pad oxide layer by using hydrofluoric acid (HF).

2. The method of claim 1, wherein said implanting step uses an energy between about 1 keV and 10 keV.

3. The method of claim 1, wherein said implanting step uses a dosage between about 1 $E15/cm^3$ and 1 $E17/cm^3$.

4. The method of claim 1, wherein said implanting step uses tilt angles between about 7° and 30°.

5. The method of claim 1, wherein the twist angle of said implanting step is 90°.

6. The method of claim 1, wherein the thickness of said silicon oxide layer is between about 3000 angstroms and 14000 angstroms.

7. The method of claim 1, wherein the thickness of said siliconoxynitride layer is between about 25 angstroms and 200 angstroms.

8. The method of claim 1, wherein the step of forming said siliconoxynitride layer comprises using a thermal oxidation process.

9. The method of claim 8, wherein the temperature of said thermal oxidation process is between about 650° C. and 900° C.

10. The method of claim 1, wherein the step of forming said silicon oxide layer comprises a high-density plasma chemical vapor deposition (HDPCVD) process.

11. The method of claim 1, wherein the step of removing the excess portion of said silicon oxide layer comprises etch back and chemical mechanical polishing process.

12. A method for forming shallow trench isolation, comprising the steps of:

forming sequentially a mask layer and a pad oxide layer on a substrate;

forming an opening through said mask layer and said pad oxide layer to expose a portion of said substrate;

etching said exposed substrate for forming trenches inside said substrate;

implanting nitrogen ions into the sidewall of said trenches to form a silicon nitride layer wherein the implant energy of said implanting nitrogen ions is between about 1 keV and 10 keV;

forming a siliconoxynitride layer on said sidewall of said trenches by using a thermal oxidation process for a substantially same thickness between said nitride layer and said siliconoxynitride layer, wherein the temperature of said thermal oxidation process is between about 650° C. and 900° C. after said step of implanting nitrogen ions;

forming a silicon oxide layer on said siliconoxynitride layer and said mask layer by using a high-density plasma chemical vapor deposition process;

removing the excess portion of said silicon oxide layer over said mask layer to expose said mask layer; and removing said mask layer.

13. A method for forming shallow trench isolation, comprising the steps of:

forming a pad oxide layer on a substrate;

forming a mask layer on said pad oxide layer;

forming an opening through said mask layer and said pad oxide layer such that regions of said substrate are exposed;

etching said exposed regions for forming trenches inside said substrate;

implanting nitrogen ions into the sidewall of said trenches to form a silicon nitride layer;

forming a siliconoxynitride layer on said sidewall of said trenches by using a thermal oxidation process for a substantially same thickness between said nitride layer and said siliconoxynitride layer, wherein the temperature of said thermal oxidation process is between about 650° C. and 900° C. after said step of implanting nitrogen ions;

forming a silicon oxide layer on said siliconoxynitride layer and said mask layer by using a high-density plasma chemical vapor deposition process;

removing the excess portion of said silicon oxide layer over said mask layer to expose said mask layer;

removing said mask layer; and removing said pad oxide layer by using hydrofluoric acid (HF).

14. The method of claim 13, wherein said implanting step uses an energy between about 1 keV and 10 keV.

15. The method of claim 13, wherein said implanting step uses a dosage between about 1 E15/cm$^3$ and 1 E17/cm$^3$.

16. The method of claim 13, wherein said implanting step uses tilt angles between about 7° and 30°.

17. The method of claim 13, wherein the twist angle of said implanting step is 90°.

18. The method of claim 13, wherein the thickness of said silicon oxide layer is between about 3000 angstroms and 14000 angstroms.

19. The method of claim 13, wherein the thickness of said siliconoxynitride layer is between about 25 angstroms and 200 angstroms.

20. The method of claim 13, wherein the step of removing the excess portion of said silicon oxide layer comprises etch back and chemical mechanical polishing process.

* * * * *